United States Patent [19]

Ozawa et al.

[11] 4,288,702
[45] Sep. 8, 1981

[54] IMAGE PICKUP DEVICE HAVING ELECTRODE MATRIX COUPLING

[75] Inventors: Takashi Ozawa; Mutsuo Takenouchi, both of Ebina, Japan

[73] Assignee: Fuji Xerox Co., Ltd., Tokyo, Japan

[21] Appl. No.: 94,619

[22] Filed: Nov. 15, 1979

[30] Foreign Application Priority Data

Dec. 18, 1978 [JP] Japan .................. 53-157826

[51] Int. Cl.³ .................... H01L 27/14; H01L 31/00
[52] U.S. Cl. .......................... 250/578; 250/211 J; 357/32
[58] Field of Search .............. 250/211 J, 578; 357/30, 357/32; 358/213, 212; 315/155

[56] References Cited

U.S. PATENT DOCUMENTS 3,935,446 1/1976 Michon .................... 357/32 X
4,012,767 3/1977 Brown et al. ................ 357/30 X

*Primary Examiner*—David C. Nelms
*Assistant Examiner*—Edward P. Westin
*Attorney, Agent, or Firm*—Sughrue, Mion, Zinn, Macpeak and Seas

[57] ABSTRACT

An impage pickup device for reading documents without the use of a separate optical system and in which complex wiring connections are provided upon the same substrate as the photosensitive reading elements. Parallel individual electrodes arranged in groups are disposed upon one surface of an insulating substrate with each electrode within each of the groups being of a different length. A layer of photoconductive material is disposed over first parallel end portions of the individual electrodes with common electrodes, one of which is provided for each of the groups, disposed over the photoconductive layer opposite corresponding groups of individual electrodes. A layer of insulating material is disposed over second staggered end portions of the individual electrodes with parallel common conductors perpendicular to the individual electrodes arrayed upon the upper surface of the insulating layer. Each of the common conductors is coupled through apertures in the insulating layer to a corresponding single individual electrode from each of the groups. Preferably, at least one of the individual electrode and common electrode is transparent.

4 Claims, 8 Drawing Figures

IMAGE PICKUP DEVICE HAVING ELECTRODE MATRIX COUPLING

BACKGROUND OF THE INVENTION

The invention relates to an image pickup device which is adapted for permitting the construction of an optical image reading device such as may be used for reading documents which are both small in size and low in manufacturing cost.

Heretofore, a MOS photodiode array or a CCD (charge-coupled device) had been employed as an image pickup device in a facsimile transmission device or the like. Since such image pick-up devices are manufactured by IC techniques, the size of the image pickup element itself is small. Therefore, in reading an original document, the image must be reduced in size using a lens. Accordingly, the alignment of the image pickup element with the optical system must be precise. In addition to this problem, it has hitherto been difficult to reduce the overall size of the image pickup device.

A system for reading an original document has been known in the art in which the size of the image pickup elements corresponds to the width of the original document to be read and an optical fiber array or a lens array is employed as an optical system for effecting one-to-one image formation. In such a system, the image pickup elements are formed on an insulating substrate such as a glass plate by subjecting a photoconductive semiconductor to vacuum evaporation using a mask. According to this system, the optical path for image formation is short so that therefore it is possible to miniaturize the device. However, the system is still disadvantageous in that the circuit required for scanning and driving the image pickup elements is ordinarily quite bulky. That is, in order to scan the image pickup element, it is necessary to provide as many switching elements as there are arrays of image pickup elements. Accordingly, a large space for incorporating a number of switching elements is required and the number of connecting conductors is increased which in turn prevents the miniaturization of the device.

Furthermore, in the conventional system, thin conductors or conductors on a flexible sheet are used to connect the image pickup elements to the drive circuit. Accordingly, it takes a relatively long time to inspect the wiring and the associated manufacturing costs are high.

This invention is intended to eliminate the above-described difficulties accompanying a conventional image pickup device so as to provide a reading device both small in size and simple in construction.

An object of the invention is to improve the durability of an image pickup device against external conditions such as for instance vibration by providing intricate wiring associated therewith on the same substrate as the image pickup device itself.

Another object of the invention is to make it possible to employ photoetching or screen printing techniques for matrix wiring thereby to improve the manufacturing productivity of the device.

A further object of the invention is to make it possible to optically inspect a matrix wiring section thereby to simplify the inspection process.

SUMMARY OF THE INVENTION

These, as well as other objects of the invention, may be met by providing an image pickup device including a plurality of individual electrodes divided into a plurality of groups with each of the groups disposed on the surface of an insulating substrate with a layer of a photoconductive film covering portions of the individual electrodes. A plurality of common electrodes is disposed on an opposite surface of the photoconductive film opposite to the groups of individual electrodes forming light receiving elements therewith. The individual electrodes are interconnected by common conductors in the form of a matrix with one of the common conductors connecting corresponding ones of individual electrodes from each of the groups. At least one of the individual electrodes and the common electrodes is transparent so that when an optical image is projected onto the light receiving elements, signal charges produced at each of the light receiving elements are stored in a stray capacitor in a common wiring section of the device. The common wiring section consisting of the common conductors is formed on the substrate of the light receiving elements. The length of each common conductor of the common wiring section is sufficiently longer than the length of each individual electrode so that the impedences and stray capacitances of the wiring connections from the light receiving elements to the matrix wiring ends are substantially equal.

Still further, the invention may be practiced by an image pickup device including an insulating substrate, a plurality of parallel individual electrodes arranged in groups and disposed upon a surface of the substrate with each electrode within each of the groups having a different length than the other electrodes within the same group, a layer of photoconductive material disposed over first end portions of the individual electrodes, a plurality of common electrodes with one of the common electrodes provided for each of the groups of individual electrodes wherein each of the common electrodes is disposed upon the layer of photoconductive material opposite a corresponding group of individual electrodes, a layer of insulating material disposed over a second end portion of the individual electrodes and a plurality of parallel common conductors disposed upon the layer of insulating material opposite the second end portions of the individual electrodes with the number of common electrodes being the same as the number of individual electrodes in one of the groups with each of the common electrodes coupled through apertures in the layer of insulating material to one of the individual electrodes in each of the groups. The individual electrodes and common conductors are preferably disposed substantially perpendicular to one another. Also, it is preferred that at least one of the individual electrodes and the common electrodes be transparent. The first end portions of the individual electrodes are preferably in alignment with one another.

DESCRIPTION OF THE PREFERRED EMBODIMENTS

Figure 1A:
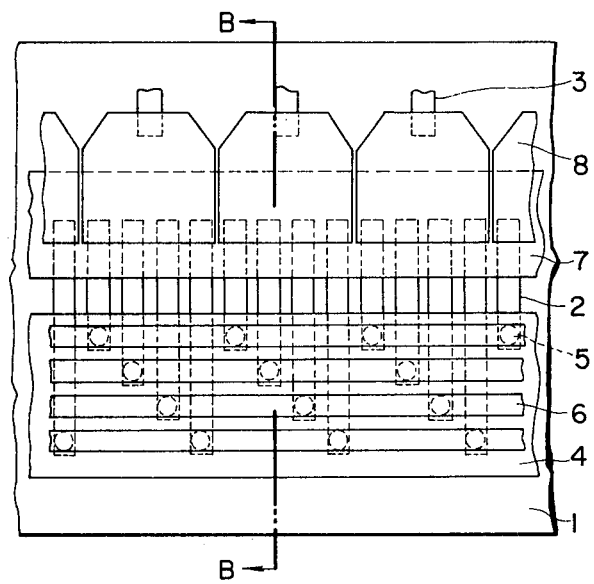
FIG. 1A is a plan view of one embodiment of the invention.
Figure 1B:
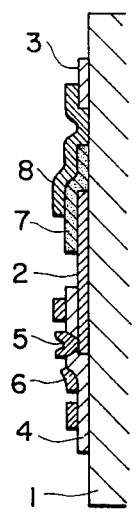
FIG. 1B is a cross-sectional view taken along the lein V—V of FIG. 1A.

FIGS. 1A and 1B schematically illustrate the arrangement of an image pickup device according to the invention. More specifically, FIGS. 1A and 1B are a front view and a cross-sectional view of the image pickup device, respectively.

In FIGS. 1A and 1B reference numeral 1 designates a substrate, and reference numeral 2 designates individual electrodes the number of which corresponds to the number of reading picture elements. The individual electrodes are different in length from one another so that multi-layer wiring can be implemented. The device further includes an insulating layer 4, common conductors 6, through-holes 5 by which the individual electrodes 2 are connected to the common conductors 6, a photoconductive semiconductor layer 7, transparent electrodes 8, with the photoconductive semiconductor layer 7 being provided between the individual electrodes 2 and the transparent electrode 8, and leading electrodes 3 adapted to connect the transparent electrodes 8 to an external drive circuit.

Figure 2A:
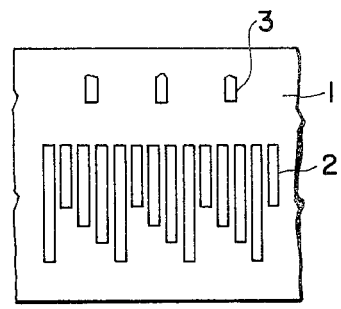
FIGS. 2A-2E are diagrams for a description of a method of manufacturing the device shown in FIG. 1.

A method of manufacturing the image pickup device will be described with reference to FIGS. 2A–2E. The substrate 1 is provided with a surface which is made of an insulating material such as glass, ceramic, or resin, for instance, epoxy and polyimide. The individual electrodes 2 and the leading electrodes 3 are formed on the substrate 1 by photoetching or vacuum evaporation using a mask as shown in FIG. 2A. The material of the individual electrodes 2 and the leading electrodes 3 is a metal such as silver or chromium having a thickness of about 500 to 1000 Å. The individual electrodes 2 are arranged, for instance, six to ten electrodes/mm so that the pitch thereof corresponds to a desired resolution capability. It is desirable that adjacent individual electrodes be different in length from each other so that multi-layer wiring can be implemented.

Figure 2B:
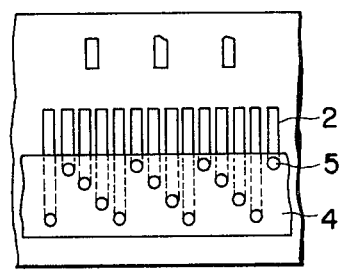

As shown in FIG. 2B, the above-described individual electrodes 2 are covered with the insulating layer 4. In this case, the through-holes 5 are formed at the positions where the individual electrodes 2 must be connected to the common conductors 6 for the multi-layer wiring. The through-holes may be formed by subjecting the insulation material to vacuum evaporation using a mask, or by a method in which after the insulating material is applied to the entire surface by vacuum evaporation the through-holes are formed in the insulation material layer by photoetching, or by screen printing.

Figure 2C:
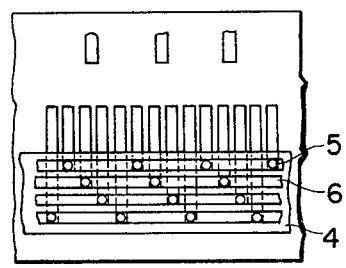

The common conductors 6 are provided on the insulating layer 4 as shown in FIG. 2C. The common conductors 6 may be formed by vacuum evaporation of a metal such as silver or chromium using a mask, or by a method in which the layer of such a metal is formed by vacuum evaporation and thereafter the layer is subjected to photoetching, or by screen printing.

The common conductors 6 are connected to the respective individual electrodes 2 via the through-holes 5 formed in the insulating layer 4 to complete the matrix wiring. The ends of the common conductors 6 are connected to the drive circuit to transmit signals as will be described below.

Figure 2D:
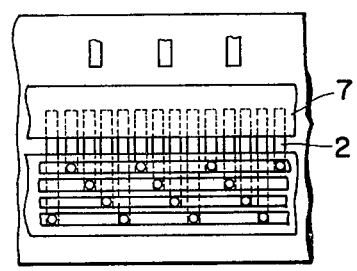

The photoconductive semiconductor layer 7 is formed in such a manner as to cover the exposed portions of the individual electrodes 2 as shown in FIG. 2D. The photoconductive semiconductor layer 7 is formed by vacuum-evaporating a non-crystalline semiconductor such as Se or Se-Te or a polycrystalline semiconductor such as CdS or CdSe to a thickness of 0.5 to 5 $\mu$m.

Figure 2E:
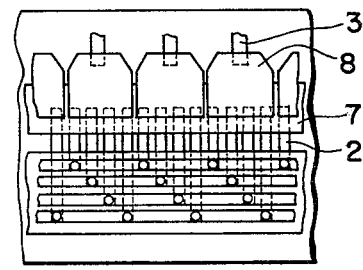

As shown in FIG. 2E, the transparent electrodes 8 are formed by sputtering $In_2O_3$ or $SnO_2$. One of transparent electrodes 8 is provided for corresponding groups of electrodes 2. The transparent electrodes 8 overlap the individual electrodes 2 to a certain extent so that the photoconductive semiconductor layer 7 is interposed between the electrodes 2 and 8. The transparent electrodes 8 are brought into contact with the leading electrodes 3 for connection to the external circuit. The sandwich structures formed by the transparent electrodes 8, the photoconductive semiconductor layer 7 and the individual electrodes 2 form photodiodes.

Figure 3:
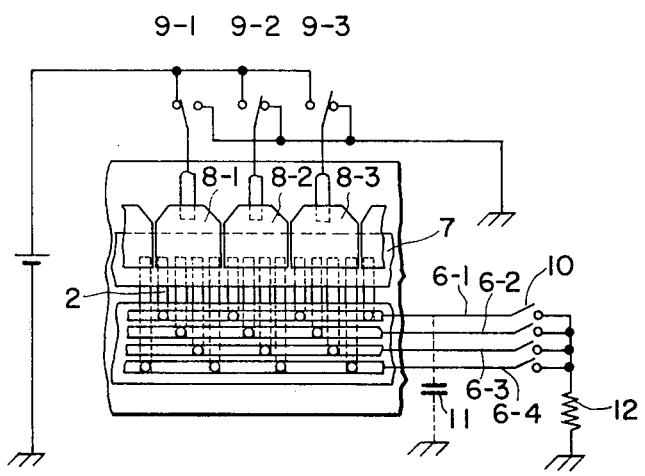
FIG. 3 is a schematic diagram of a circuit for driving the device shown in FIG. 1.

With reference to the circuit diagram of FIG. 3, in order to produce an optical signal, a selected transparent electrode 8-1 is positively biased by a switch 9-1, while the remaining transparent electrodes 8-2 and 8-3 are grounded by switches 9-2 and 9-3. As a result, "optical" current flows which corresponds to the optical information impressed upon the transparent electrode 8-1. This current charges a stray capacitor 11 formed by the individual electrodes 2, the common conductor 6 and a switch 10. When the stored charge has reached a predetermined amount, the switch 9-1 is grounded to hold the charges thus stored. Thereafter, the switch 10 is closed to discharge the charge in the stray capacitor 11 through a load resistor 12 thereby providing signal current through resistor 12.

According to this method, even if the optical current is extremely small, as reading is effected only after the optical current has been stored for a certain length of time, a high S/N ratio is obtained. Furthermore, since the wiring components for storing the signal charges are formed on the substrate of the light receiving elements, there is very little leaked charge and consequently the external noise is reduced.

The matrix wiring is formed on the substrate of the light receiving elements and the terminals thereof are connected to the external switches as a result of which the impedances and stray capacitances due to the wiring of the light receiving elements to the switches are substantially equal to one another because the common conductors 6-1 through 6-4 are much longer than the individual electrodes 2. If the matrix wiring is shielded, then disturbances by external noise can be prevented. This shielding can be readily and effectively added as the matrix wiring is formed integrally on the substrate. To this effect, a conductive material vacuum-evaporated or coated over an insulating layer formed over the entire surface of the substrate is also covered with a conductive material layer. The conductive material layers on both sides of the substrate may then be grounded.

In the embodiment of the invention described above, each transparent electrode 8 is provided with four individual electrodes 2 and four common conductors 6. However, it should be noted that the invention is not limited thereto or thereby. That is, the number of individual electrodes 2 and corresponding common conductors 6 are optional. Furthermore, the invention may be so modified that the transparent electrodes 8 are metal electrodes, the individual electrodes 2 are transparent electrodes, and the substrate 1 is made of a transparent material so that the optical image is projected through the transparent substrate.

As is apparent from the above description, the present invention provides the following effects and advantages.

(1) Because a non-crystalline or polycrystalline photoconductive film is employed, the image pickup elements can be made to a size corresponding to the width of an original document. Furthermore, as a one-to-one optical system or contact-type optical system can be employed, the reading device can be made quite small in size.

(2) As both the light receiving element section and the matrix wiring are provided on one and the same substrate, the manufacturing yield and the reliability of the device are remarkably improved. In addition, a system of storing signal charges in the matrix wiring can be utilized which simplifies the drive circuit.

(3) With the above-described arrangement according to the invention, the size and manufacturing cost of a reading device can be markedly reduced.

What is claimed is:

1. An image pickup device comprising: a plurality of individual electrodes divided into a plurality of groups, said individual electrodes being provided on one surface of a photoconductive film; a plurality of common electrodes disposed on an opposite surface of said photoconductive film opposite said groups of individual electrodes respectively forming light receiving elements with said individual electrodes; and common conductors connecting in the form of a matrix said individual electrodes which are provided at corresponding positions respectively in said groups of individual electrodes, at least one of said individual electrodes and said common electrodes being transparent electrodes so that when an optical image is projected onto said light receiving elements signal charges provided by said light receiving elements are stored in a stray capacitor in a common wiring section, said common wiring section being formed on the substrate of said light receiving elements, and the length of each common conductor of the common wiring section is sufficiently longer than the length of each individual electrode such that the impedances and stray capacitances of wirings from said light receiving elements to matrix wiring ends are substantially equal to one another.

2. An image pickup device comprising:
an insulating substrate;
a plurality of parallel individual electrodes arranged in groups and disposed upon a surface of said substrate, each electrode within each of said groups being of a different length than other electrodes within the same group;
a layer of photoconductive material disposed over first end portions of said individual electrodes;
a plurality of common electrodes, one of said common electrodes being provided for each of said groups of individual electrodes, each of said common electrodes being disposed upon said layer of photoconductive material opposite a corresponding group of individual electrodes;
a layer of insulating material disposed over second end portions of said individual electrodes; and
a plurality of parallel common conductors disposed upon said layer of insulating material opposite said second end portions of said individual electrodes, the number of said common electrodes being the same as the number of individual electrodes in one of said groups, each of said common electrodes being coupled through apertures in said layer of insulating material to one of said individual electrodes in each of said groups.

3. The image pickup device of claim 2 wherein said individual electrodes and said common conductors are disposed substantially perpendicular to one another.

4. The image pickup device of either claim 1 or 2 wherein one of said individual electrodes and said common electrodes are metallic electrodes and the other of said individual electrodes and said common electrodes are transparent electrodes.

* * * * *